United States Patent [19]
Yuan et al.

[11] 3,909,748
[45] Sept. 30, 1975

[54] DIGITALLY CONTROLLED OSCILLATOR USING SEMICONDUCTOR CAPACITANCE ELEMENTS

[75] Inventors: Shui Yuan, Princeton, N.J.; Raymond Louis Camisa, Yorktown Heights, N.Y.

[73] Assignee: RCA Corporation, New York, N.Y.

[22] Filed: May 30, 1974

[21] Appl. No.: 474,717

[52] U.S. Cl. .......... 331/117 R; 331/177 V; 331/179
[51] Int. Cl.² ........................ H03B 3/04; H03B 5/12
[58] Field of Search ........ 331/117 R, 177 R, 177 V, 331/179

[56] References Cited

UNITED STATES PATENTS

| | | | |
|---|---|---|---|
| 3,538,450 | 11/1970 | Andrea et al. | 331/179 X |
| 3,614,665 | 10/1971 | Weller et al. | 331/179 X |
| 3,668,553 | 6/1972 | Dunn et al. | 331/179 X |
| 3,778,645 | 12/1973 | Mattauch et al. | 331/179 X |

*Primary Examiner*—Siegfried H. Grimm
*Attorney, Agent, or Firm*—H. Christoffersen; Samuel Cohen

[57] ABSTRACT

The tuned circuit of an oscillator includes *n* metal-insulator-semiconductor (MIS) diodes. The oscillator frequency may be switched, in discrete steps, to any one of $2^n$ different values in response to *n* control voltages, representing an *n* bit binary word, applied to the respective diodes.

4 Claims, 4 Drawing Figures

DIGITALLY CONTROLLED OSCILLATOR USING SEMICONDUCTOR CAPACITANCE ELEMENTS

It is often desirable to have the capability to vary the frequency of operation of communications equipment in discrete steps. One example is in military communications where the frequency to which a receiver or transmitter is tuned must be switched from one preset frequency channel to another. A second example is television.

Another desired capability is the ability to achieve the digital frequency selection by electronic means. Such a tuning technique permits channel selection at a rate higher than that possible using mechanical means. In addition, the electronic tuner avoids the problem of wear and fatigue normally associated with mechanical tuning devices. Electronic tuning also permits realization of communications systems whose frequency of operation can be controlled by digital computers.

The principal tuning element used in present electronically tuned oscillators is the varactor diode. While offering the advantage of electronic tuning, varactor circuits suffer from several shortcomings. A varactor diode is an analog device. To tune such a device in discrete, precisely known frequency steps, requires a frequency sensing circuit to determine when the desired frequency has been attained, thus increasing system complexity. Since the capacitance presented across the diode is a function of the amplitude of the bias voltage, any instability in the bias voltage amplitude can give rise to undesirable frequency shifts in the varactor oscillator. Circuit complexity increases in proportion to the degree of bias stability required.

Where the voltage for the control of a varactor oscillator's frequency is in a digital format, additional circuitry is needed to convert the digital tuning command to the analog voltage required for controlling the varactor. Once more, circuit complexity is increased and, in addition, the presence of a digital-to-analog converter limits the rate at which the frequency can be varied because of the time that is required to convert each digital command to an analog voltage.

The present invention permits variation of its frequency of operation in discrete frequency steps. Furthermore, this frequency variation is achievable by electronic means but the technique used avoids the problems discussed above. An oscillator, according to the preferred embodiment of the invention, includes a tuned circuit and an array of frequency control networks, each including a voltage variable capacitor. Each frequency control network is capable of assuming only one of two states, each at a different capacitance value. Each network is controlled by a different control voltage which, when greater than a given threshold value, switches the voltage variable capacitor to one state and when lower than a second threshold value switches the capacitor to its other state.

The invention is described in greater detail below and is illustrated in the drawing of which:

Figure 1:
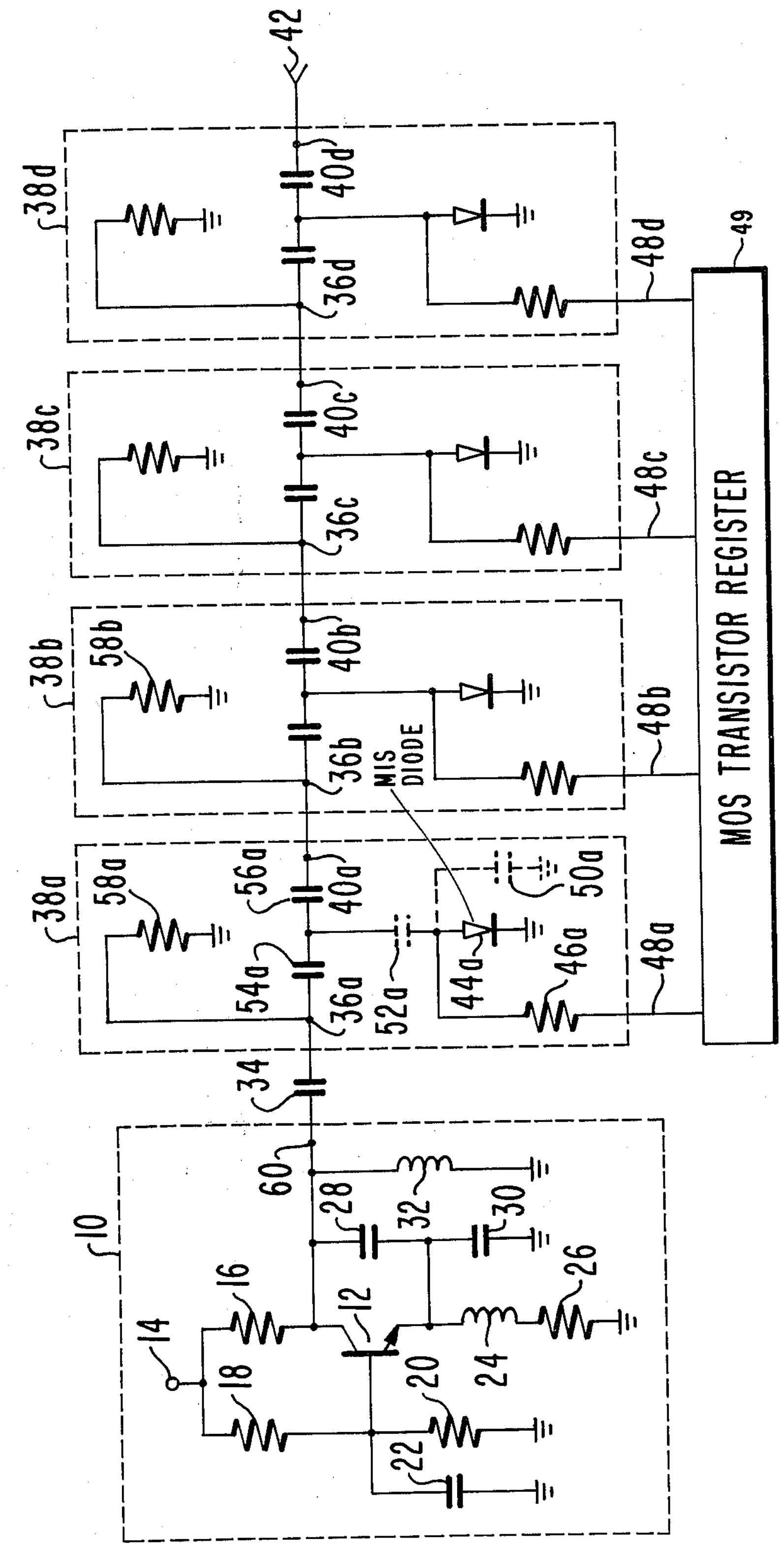
FIG. 1 is a schematic circuit diagram of a preferred embodiment of the invention.

In FIG. 1, the base electrode of transistor 12 is coupled through resistor 18 to the supply voltage terminal 14 and through the parallel combination of resistor 20 and capacitor 22 to a point of reference potential (ground). The emitter electrode of transistor 12 is coupled to ground through the series combination of inductor 24 and resistor 26 in parallel with capacitor 30. Capacitor 28 is coupled between the collector and emitter electrodes of transistor 12 while inductor 32 is connected between the collector electrode and ground.

Capacitor 34 couples the collector electrode of transistor 12 to the input terminal 36*a* of diode network 38*a*. Diode networks 38*a*, 38*b*, 38*c* and 38*d* are identical and are connected to one another, as shown: output terminal 40*a* of network 38*a* is connected to input terminal 36*b* of network 38*b*; output terminal 40*b* of network 38*b* is connected to input terminal 36*c* of network 38*c* and so on. The output terminal of the last network 38*d* serves as the oscillator output terminal 42. Within a specific diode network, components are identified by a number followed by the letter associated with that network.

Within a diode network, such as 38*a*, the anode of diode 44*a* is coupled by resistor 46*a* to terminal 48*a*. The cathode of diode 44*a* is connected to ground. The anode of diode 44*a* is also connected to the junction of capacitors 54*a* and 56*a*. The other ends of capacitors 54*a* and 56*a* are connected to terminals 36*a* and 40*a*, respectively. Resistor 58*a* is connected between terminal 36*a* and ground.

In the operation of the circuit of FIG. 1, the components within dashed block 10 represent an oscillator known in the art. Resistors 18 and 20 provide bias current for the base circuit of transistor 12. Emitter resistor 26 provides degenerative feedback to improve the bias stability of transistor 12 while inductor 24 functions as a radio frequency choke. Common-base operation is achieved for transistor 12 by capacitor 22 which provides a low impedance path to ground for the base of transistor 12 at the frequency of oscillation. Resistor 16 and the tuned circuit of inductor 32 and capacitors 28 and 30 provide the collector load for oscillator 10. Collector-emitter feedback is provided by capacitor 28. With no load connected to the oscillator output terminal 60, the frequency of oscillation is determined primarily by the values of reactive elements 28, 30 and 32 and to a lesser degree by the transistor parameters. When networks 38*a*–38*d* are connected to terminal 60, the frequency of oscillation will be modified in a manner to be discussed in detail shortly.

Figure 2:
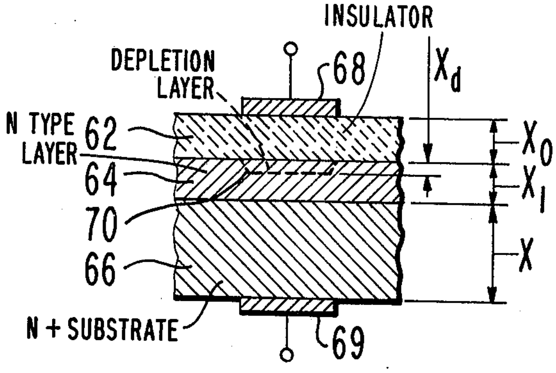
FIG. 2 illustrates the physical construction of a device having the voltage sensitive characteristics described herein.
Figure 3:
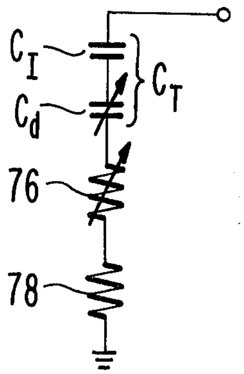
FIG. 3 is a schematic circuit diagram of the device shown in FIG. 2.

The diode 44 within each network 38 is shown in cross-section in FIG. 2. The approximate equivalent circuit for this metal-insulator-semiconductor (MIS) diode is shown in FIG. 3. The structure includes a thin insulator 62 on the surface of an epitaxially grown semiconductor (*n* type 64 on *n*+ substrate 66). Metal electrodes 68 and 69 are located on opposite surfaces, respectively, of the device.

In operation, when a voltage which is relatively negative at electrode 68 with respect to the voltage at electrode 69 is applied across the device, a depletion layer 70, shown by dashes, of depth $X_d$, is formed at the semiconductor-insulator interface. As the magnitude of the applied voltage is increased, the depletion layer becomes larger until it reaches a maximum depth $X_{dm}$.

Figure 4:
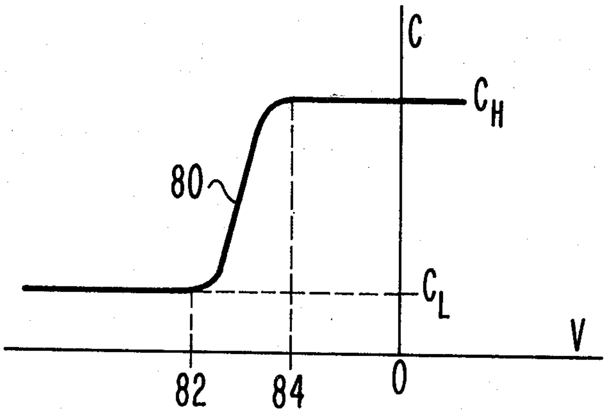
FIG. 4 illustrates the voltage versus capacitance characteristics of the device presented in FIG. 2.

This limit is due to the formation of a semiconductor inversion layer. The capacitance versus voltage characteristic of the device is shown in FIG. 4. The equivalent circuit presented in FIG. 3 includes an insulator capacitance $C_I$, a surface depletion capacitance $C_d$, a resistance 76 measured from the edge of the depletion layer to the edge of the substrate 66 and a substrate resistance 78. The total capacitance of the device $C_T$ is the series combination of $C_I$ and $C_d$. Since the two capacitors are in series, the smaller value will dominate $C_T$.

Capacitance is inversely proportional to the depletion depth. Therefore, when a relatively small negative bias is applied to terminal 68, the depletion region $X_d$ is very small. $C_I$ is very much less than $C_d$ and the total capacitance approaches the value of $C_I$. This condition represents the maximum capacitance state of the device, shown in FIG. 4 as $C_H$. As electrode 68 is made increasingly more negative with respect to electrode 69, an upper voltage threshold 84 is reached where the device capacitance begins to decrease.

In the region 80, capacitors $C_I$ and $C_d$ have values of the same order of magnitude and $C_T$ is determined by the values of $C_I$ and $C_d$ at a particular voltage. As the magnitude of the voltage at terminal 68 is further increased, lower voltage threshold 82 is reached. At this voltage, the depletion capacitance $C_d$ is much smaller than the insulator capacitance and the total capacitance will approach the value of $C_d$. Increasing the magnitude of the bias voltage beyond value 82 will have no further effect upon the device capacitance. The minimum capacitance state, shown as $C_L$ in FIG. 4 will have been reached.

Returning once more to the circuit of FIG. 1, only the network 38*a*, which is representative, will be discussed. Within this network is an MIS device 44*a* having the above-described properties. Such a device, as a result of fabrication tolerances, may not have the desired values of upper and lower diode capacitance. For example, the absolute capacitance of the device is determined in part by the electrode area. The desired surface area may not be exactly realized during fabrication. In this case, a selection process may be required to obtain devices with the correct capacitance values.

As an alternative to the use of only devices having the exact capacitance values, a shunt capacitor 50*a* and a series capacitor 52*a* (both shown in phantom and only in network 38*a*, although if used they may be present in all networks) may be inserted in the circuit. These capacitors may be tunable trimming capacitors or may be fixed capacitors of the appropriate value to achieve the desired upper and lower capacitance values for each network.

The required values of capacitors 50*a* and 52*a* may be determined empirically or algebraically in the following manner. Assume that the desired upper capacitance $C_H'$ is 2pf and the lower capacitance $C_L'$ is 1pf. Knowing the capacitance of the device in each state, an equation may be written for the network capacitance for each diode capacitance state. Each equation is then equated to the desired capacitance for the corresponding diode state, yielding two simultaneous equations in two unknowns. Thus, for a device having upper and lower capacitance values of 3.0 and 0.5pf, respectively, the equations would be:

$$C_H' = 2 = C_{52a}(3.0 + C_{50a})/(C_{52a} + C_{50a} + 3.0)$$

and $$C_L' = 1 = C_{52a}\ (0.5 + C_{50a})/(C_{52a} + C_{50a} + 0.5).$$

Solving the above equations yields values of 4.2 and .81pf for capacitors 52*a* and 50*a*, respectively. Therefore, device selection may be avoided by the use of external capacitors. The above-described technique can only be used where the high/low capacitance ratio for the device is greater than the desired ratio. This is because the addition of capacitor 50*a* or 52*a* has the effect of lowering the high/low capacitance ratio. If the device ratio were already lower than the desired value, the former ratio could not be increased by the addition of any positive values of capacitors 50*a* or 52*a*.

Bias voltage is applied via terminal 48*a* through resistor 46*a*. This voltage may be derived from a register such as the metal-oxide semiconductor control register 49 illustrated, which in turn is driven by logic or control circuits (not shown), or from logic circuits directly, or may be voltages applied via mechanical switches or by other means. Resistor 46*a* prevents excessive charging current through the device capacitors. Capacitors 54*a* and 56*a* provide direct current isolation between the diode networks so that a bias voltage applied to one network will not affect any other network. These capacitors are short circuits at the frequencies of interest. Resistor 58*a* (and 58*b* of network 38*b*) provides a discharge path to prevent any accumulation of charge upon capacitors 54*a* and 56*a*.

When the combined diode networks are connected to oscillator 10 through coupling capacitor 34, additional capacitance is added to the tuned circuit formed by elements 28, 30 and 32 resulting in a frequency of oscillation for the combination that is lower than the frequency of oscillation for 10 alone. The frequency of oscillation of the entire oscillator-diode network combination will be a minimum when the four diodes are all in their high capacitance state and a maximum when the diodes are all biased for minimum capacitance.

The ratio of high to low capacitance for each diode and the relative capacitance values of the diodes with respect to each other are controlled during the diode design and fabrication. These ratios may be selected to achieve advantageous results. In the present embodiment, for example, each diode is chosen so that its network has a high-to-low capacitance ratio of 2:1. Each network, in its low capacitance state has double the capacitance of the preceding network. Thus, these four networks have low state capacitance values in the ratios 1:2:4:8. A total of $2^n$ discrete frequency steps is possible in the system, where $n$ is the number of networks 38. In the embodiment illustrated, where there are four such networks, there are $2^4$ or 16 such steps.

In one embodiment of the invention, tuning may be accomplished in a band from 25.80MHz to 26.55MHz in 0.05MHz steps. For a resonant frequency of 26.55MHz, inductor 32 has a value of 150nH. The total capacitance $C_Y$ needed is 250pf. $C_Y$ represents the series combination of capacitors 28 and 30 and the contribution of each diode network, connected in parallel with the oscillator tuned circuit. The series combination of capacitors 28 and 30 is 219pf. Capacitors 28 and 30 equal approximately 330 and 660pf, respectively. The high/low capacitance values of networks 38*a*, *b*, *c* and *d* are 16/8, 8/4, 4/2 and 2/1pf, respectively.

For the present embodiment, each 1pf variation in the capacitance of the tuning network produces a 0.05MHz variation in the frequency of oscillation. In general, the variation of frequency with respect to variations in the capacitance of a tuning network containing inductance and capacitance is not a linear function. The frequency of oscillation is inversely proportional to the square root of the product of the inductance and capacitance values. Such a relationship is non-linear. The present embodiment realizes a linear variation of frequency with respect to a constant increment of capacitance variation because the incremental variation of capacitance is small with respect to the total capacitance present in the tuned circuit.

The use of MIS devices in electronically tuned oscillator circuits offers several advantages not present with varactor oscillators. By selecting bias voltages so that the MIS diode is operated as a capacitance having two discrete values (operation in region 80, that is, 82 to 84, of FIG. 4 is avoided), the capacitance will remain essentially constant over a wide range of bias voltage values. For example, as long as the voltage remains less than the voltage 82 necessary to maintain the device in a low capacitance condition or greater than the voltage 84 needed to maintain the high capacitance condition, the capacitance in each condition remains constant. This latter voltage may even be a positive value. Unlike a varactor diode, the capacitive properties of the MIS device are not destroyed by forward biasing the device. An oscillator whose frequency is controlled by an MIS device therefore has the distinct advantage of greater frequency stability as a function of the control voltage compared to standard varactor oscillators.

An additional capacitance stability consideration arises where the MIS devices are subjected to the application of signals having relatively large magnitudes, in excess of 100mW, for example. Under such a condition, variations in capacitance of the devices in their minimum capacitance states as a function of the power contained in the applied signals are possible. This is true even when the respective values of bias voltages are sufficiently large to ensure capacitance stability with respect to variations in bias voltage.

The devices may be fabricated to avoid such signal dependent variations in capacitance. The carrier density for the n type semiconductor layer, shown at 64 in FIG. 2, may be chosen such that when the device is in its minimum capacitance state, the maximum depth $X_{dm}$ of depletion layer 70 extends completely or nearly completely to the boundary of the *n*+ type semiconductor layer 66.

Voltage levels necessary to operate the MIS devices are compatible with voltages produced by such logic families as the metal-oxide-semiconductor (MOS) group. MIS controlled oscillators may thus interface directly with MOS logic circuits, permitting frequency control by the logic circuits. This avoids the need for devices such as digital-to-Analog converters that are required by varactor type oscillators. Because the time required for the voltage conversion process is eliminated in the MIS oscillators, the frequency variation may be accomplished at a rate higher than that possible in oscillators using such converters.

Another advantage of using the MIS devices for frequency control is that the devices can be maintained in a particular capacitance state without consuming any steady state dc power (except for leakage current). This is because of the presence of the insulator layer. Since there is no steady state dc current flowing, the loading of the frequency control circuit by the MIS oscillator is minimal and a given control circuit is able to control a greater number of MIS oscillators than varactor oscillators.

What is claimed is:

1. A circuit for switching the frequency of an oscillator in discrete steps to up to $2^n$ different values directly in response to *n* control voltages representing an *n* digit binary word, where *n* is an integer greater than 1, comprising in combination:

in the tuned circuit of said oscillator, *n* networks which continuously remain in the tuned circuit, said networks connected essentially in parallel with each other, each network containing a voltage controlled semiconductor capacitance element, each such element capable of assuming one capacitance value in response to a control voltage in a first relatively large range extending to $V_L$, a second capacitance value in response to a control voltage in a second relatively large range beginning at $V_H$, where the region $V_L$ to $V_H$ between these two ranges is relatively small and where $V_L$ and $V_H$ are voltages where each of said elements one capacitance value is proportional to a different power of two and the corresponding second capacitance value is a fixed multiple greater than one times said one capacitance value;

means for applying to each such element a different one of said *n* control voltages, where each control voltage is at one of two binary levels, one level in said first range and the other level in said second range; and means for decoupling each network from the remaining networks whereby the application of a control voltage to a particular network will not affect the capacitance of the remaining networks.

2. A circuit as set forth in claim 1 wherein said semiconductor capacitance elements comprise metal-insulator-semiconductor diodes.

3. A circuit as set forth in claim 2, further including metal-oxide-semiconductor means producing said n control voltages.

4. The combination of claim 1 where each means for decoupling comprises first and second capacitors serially connected between each network and an impedance connected at one end to the connection between said capacitors and at the other end to a point at a reference potential.

* * * * *